United States Patent
Childress et al.

(10) Patent No.: US 12,360,183 B2
(45) Date of Patent: Jul. 15, 2025

(54) MAGNETORESISTIVE ELEMENT AND MAGNETIC SENSOR DEVICE HAVING A HIGH SENSITIVITY AND LOW ZERO-FIELD OFFSET-SHIFT

(71) Applicant: Allegro MicroSystems, LLC, Manchester, NH (US)

(72) Inventors: Jeffrey Childress, San Jose, CA (US); Andrey Timopheev, Vif (FR)

(73) Assignee: Allegro MicroSystems, LLC, Manchester, NH (US)

( * ) Notice: Subject to any disclaimer, the term of this patent is extended or adjusted under 35 U.S.C. 154(b) by 162 days.

(21) Appl. No.: 18/551,098

(22) PCT Filed: Mar. 15, 2022

(86) PCT No.: PCT/IB2022/052318
§ 371 (c)(1),
(2) Date: Sep. 18, 2023

(87) PCT Pub. No.: WO2022/195470
PCT Pub. Date: Sep. 22, 2022

(65) Prior Publication Data
US 2024/0168108 A1    May 23, 2024

(30) Foreign Application Priority Data
Mar. 19, 2021  (EP) .................................... 21315043

(51) Int. Cl.
*G01R 33/09*  (2006.01)
(52) U.S. Cl.
CPC .................. *G01R 33/098* (2013.01)
(58) Field of Classification Search
CPC .............. G01R 33/098; G01R 33/0052; G01R 33/095; G01R 33/0005; G01R 33/0206;
(Continued)

(56) References Cited

U.S. PATENT DOCUMENTS

2008/0068007 A1 * 3/2008 Hoshiya ................. G01D 5/145
2009/0189601 A1 * 7/2009 Okada .................... G01D 5/145
                                                            324/207.21
(Continued)

FOREIGN PATENT DOCUMENTS

EP    3726237 A2    10/2020
EP    3862769 A1    8/2021

OTHER PUBLICATIONS

International Search Report issued in corresponding International PCT Application No. PCT/IB2022/052318; Mailing Date: Jun. 15, 2022.
(Continued)

*Primary Examiner* — Alvaro E Fortich
(74) *Attorney, Agent, or Firm* — DALY, CROWLEY, MOFFORD & DURKEE, LLP

(57) ABSTRACT

A magnetoresistive element has a tunnel barrier layer included between a ferromagnetic reference layer having a fixed reference magnetization and a ferromagnetic sense layer having a free sense magnetization. The sense magnetization has a ferromagnetic material composition and a stable vortex configuration in the absence of an applied magnetic field. The ferromagnetic material composition varies across the thickness of the sense layer from a composition with higher magnetization near the tunnel barrier layer to a composition with lower magnetization away from the tunnel barrier layer, such that the sense magnetization and ferromagnetic exchange strength of the sense layer are higher near the tunnel barrier layer than away from the tunnel barrier layer.

12 Claims, 4 Drawing Sheets

(58) Field of Classification Search
CPC .............. H01F 1/047; H01F 10/3254; H01F 10/3272; H01F 10/3286; H01F 10/002; H01F 10/14; H01F 10/16
See application file for complete search history.

(56) References Cited

U.S. PATENT DOCUMENTS

| | | | |
|---|---|---|---|
| 2009/0219754 A1 | 9/2009 | Fukumoto | |
| 2010/0316890 A1 | 12/2010 | Choi | |
| 2010/0320550 A1* | 12/2010 | Abraham | G11C 11/1673 257/E29.323 |
| 2017/0330070 A1* | 11/2017 | Sengupta | G06N 3/04 |
| 2020/0333407 A1* | 10/2020 | Reimann | G01R 33/022 |

OTHER PUBLICATIONS

Written Opinion issued in corresponding International PCT Application No. PCT/IB2022/052318; Mailing Date: Jun. 15, 2022.
Korean Voluntary Amendment (with Machine English Translation from Espacenet.com) filed on Jan. 16, 2025 for Korean Application No. 10-2023-7031793; 12 Pages.

* cited by examiner

MAGNETORESISTIVE ELEMENT AND MAGNETIC SENSOR DEVICE HAVING A HIGH SENSITIVITY AND LOW ZERO-FIELD OFFSET-SHIFT

TECHNICAL DOMAIN

The present invention concerns a magnetoresistive element adapted to sense an external magnetic field and having a wide linear response and a nominal performance that remains substantially unchanged after the magnetoresistive element has been subjected to high magnetic fields. The present disclosure further concerns a magnetic sensor device comprising a plurality of the magnetoresistive element.

RELATED ART

A conventional magnetoresistive sensor element typically comprises a ferromagnetic reference layer having a reference magnetization, a ferromagnetic sense layer having an averaged free sense magnetization and a tunnel barrier layer between the reference and sense ferromagnetic layers. The sense magnetization can be oriented in an external magnetic field while the reference magnetization remains substantially undisturbed. The external magnetic field can thus be sensed by measuring a resistance of the magnetoresistive sensor element. The resistance depends on the orientation and magnitude of the averaged sense magnetization relative to the reference magnetization.

The sense magnetization can comprise a stable vortex configuration. In the vortex configuration, the magnetization curls in a circular path along the edge of the sense layer and around a core reversibly movable in accordance with the external magnetic field. The vortex configuration provides a linear and non-hysteretic behavior in a large magnitude range of the external magnetic field, for practical size of the magnetoresistive sensor element and thickness of the sense layer. The vortex configuration is thus advantageous for magnetic sensor applications.

Vortex-based magnetoresistive sensors typically operate at low fields, for example external magnetic fields below 100 mT. The performance of vortex-based magnetoresistive sensors is often modified after being exposed to high magnetic fields, because such high fields can sufficiently saturate the sensor free layer magnetization that the vortex configuration no longer exists. This vortex annihilation or "expulsion" can occur for example in magnetic fields greater than 200 mT often used during magnetic reliability testing. When a vortex-based magnetoresistive sensors is subjected to such high magnetic fields, the details of the sensor magnetic configuration at low fields can be modified, and they therefore tend to suffer from zero-field offset shifts that reduces their accuracy in low field measurements.

SUMMARY

The present disclosure concerns a magnetoresistive element which comprises a tunnel barrier layer included between a ferromagnetic reference layer having a fixed reference magnetization and a ferromagnetic sense layer having a free sense magnetization. The sense magnetization comprises a ferromagnetic material composition and a stable vortex configuration in the absence of an applied magnetic field. The ferromagnetic material composition varies across the thickness of the sense layer in such a way that the sense magnetization and ferromagnetic exchange strength of the sense layer are higher near the tunnel barrier layer than away from the tunnel barrier layer.

The present disclosure further concerns a magnetic sensor device comprising a plurality of the magnetoresistive element.

With respect to what is known in the art, the magnetoresistive element disclosed herein has reduced zero-field offset-shift while having a high sensitivity. The magnetic sensor device can be exposed to high magnetic fields without significant change in its nominal performance.

SHORT DESCRIPTION OF THE DRAWINGS

Exemplar embodiments of the invention are disclosed in the description and illustrated by the drawings in which.

Figure 6:
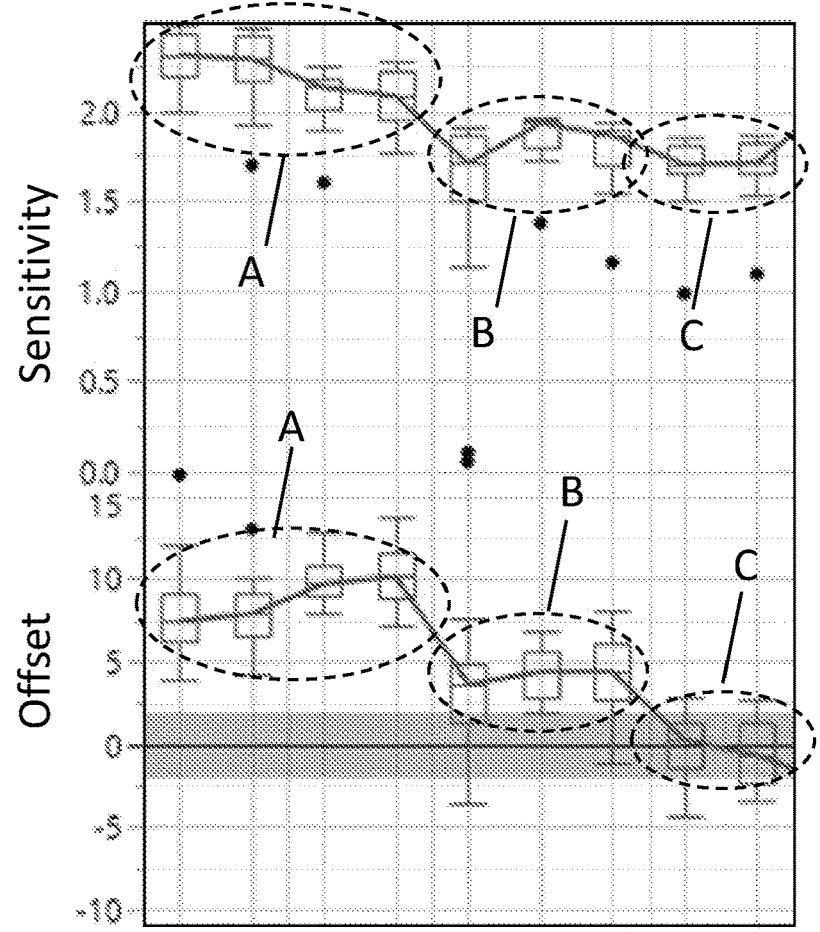

FIG. 6 reports experimental data measured for a magnetoresistive element; and

Figure 7:
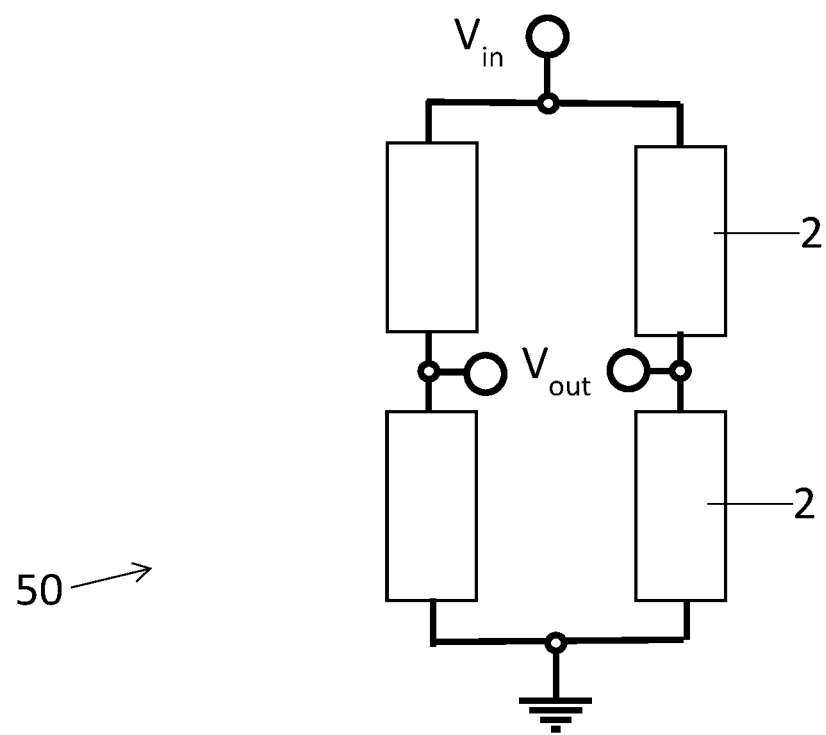

FIG. 7 shows a magnetic sensor device comprising a plurality of the magnetoresistive element arranged in a full-bridge configuration.

EXAMPLES OF EMBODIMENTS

Figure 1:
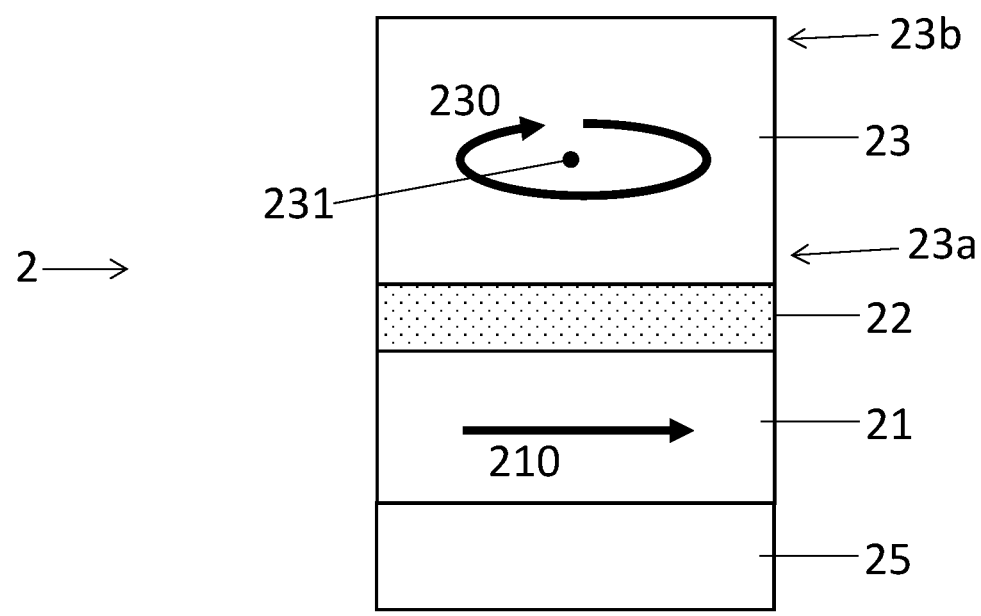
FIG. 1 illustrates schematically a magnetoresistive element comprising a sense layer, according to an embodiment.

With reference to FIG. 1, a magnetoresistive element 2 is represented according to an embodiment. The magnetoresistive element 2 comprises a tunnel barrier layer 22 included between a ferromagnetic reference layer 21 having a fixed reference magnetization 210 and a ferromagnetic sense layer 23 having a free sense magnetization 230. The sense magnetization 230 can have its average magnetization oriented in an external magnetic field 60 while the reference magnetization 210 remains substantially undisturbed. The external magnetic field 60 can thus be sensed by measuring a resistance of the magnetoresistive sensor element 2. The resistance depends on the average orientation of the sense magnetization 230 relative to the reference magnetization 210.

In a preferred configuration, the sense magnetization 230 comprises a stable vortex configuration in the absence of an applied magnetic field. The vortex configuration consists in a magnetization which follows a circular path along the edge of the sense layer 23 and around a core 231, the position of the core being reversibly movable in accordance with the external magnetic field 60. For a given lateral dimension of the magnetoresistive sensor element 2, the thickness of the sense layer 23 is chosen such that the sense layer 23 has a stable vortex configuration magnetization in the absence of an applied magnetic field.

In the example of FIG. 1, the reference magnetization 210 is substantially longitudinally oriented in the plane of the reference layer 21. The magnetoresistive element 2 may comprise a reference pinning layer 25 configured to exchange couple the reference layer 21. In the presence of the reference pinning layer 25, the orientation of the reference magnetization 210 is determined by the exchange coupling (generating an exchange-bias) between the reference pinning layer 25 and the reference layer 21. The reference pinning layer 25 can comprise an antiferromagnet (AFM). The reference layer 21 can comprise a synthetic antiferromagnet (SAF).

In an embodiment, the sense layer 23 comprises, or is formed of, a ferromagnetic material. The chemical composition of the ferromagnetic material varies across the thickness of the sense layer 23 from a composition with higher magnetization near the tunnel barrier layer 22 to a composition with lower magnetization away from the tunnel barrier layer 22.

A specific chemical composition of the ferromagnetic material provides a high sense magnetization 230. Here, the expression "magnetization" is used indifferently for "saturation magnetization" or "spontaneous magnetization", where saturation magnetization has its usual meaning of the maximum induced magnetic moment. A ferromagnetic material composition yielding a high sense magnetization 230 provides a high ferromagnetic exchange strength. The ferromagnetic exchange strength can be tuned by varying the sense magnetization 230 and thus, by varying the chemical composition of the ferromagnetic material.

The variation of the ferromagnetic material composition across the thickness of the sense layer 23 results in a variation of magnetic properties across the sense layer thickness. Here, the sense layer 23 is configured such that the sense magnetization 230 and ferromagnetic exchange strength of the sense layer 23 are higher near the tunnel barrier layer 22 than away from the tunnel barrier layer 22.

Figure 2:
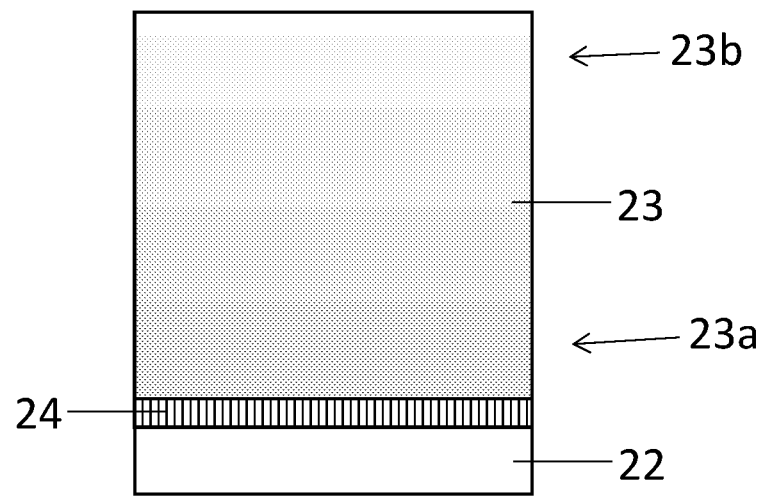
FIG. 2 represents the sense layer comprising a ferromagnetic material having a composition gradient across the thickness of the sense layer, according to an embodiment.

In one aspect illustrated in FIG. 2, the ferromagnetic material composition comprises a composition gradient across the thickness of the sense layer 23. The composition gradient can be linear or nonlinear across the thickness of the sense layer 23. Here, the sense layer 23 can be formed as comprising a single layer having the composition gradient.

Figure 3:
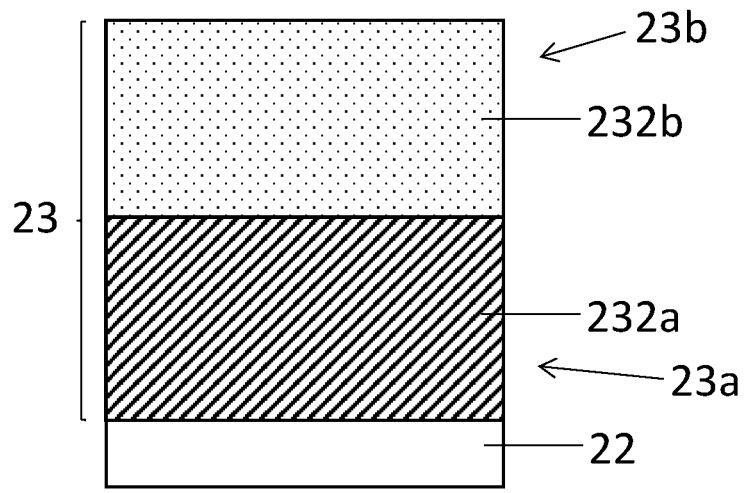
FIG. 3 represents the sense layer comprising a multilayer structure, according to an embodiment.

In another aspect illustrated in FIG. 3, the sense layer 23 comprises a multilayer structure. The multilayer structure can comprise a first sublayer 232a, near the tunnel barrier layer 22 and having a chemical composition resulting in high magnetization. The multilayer structure can further comprise a second sublayer 232b, away from the tunnel barrier layer 22 and having a chemical composition resulting in a lower magnetization.

Figure 4:
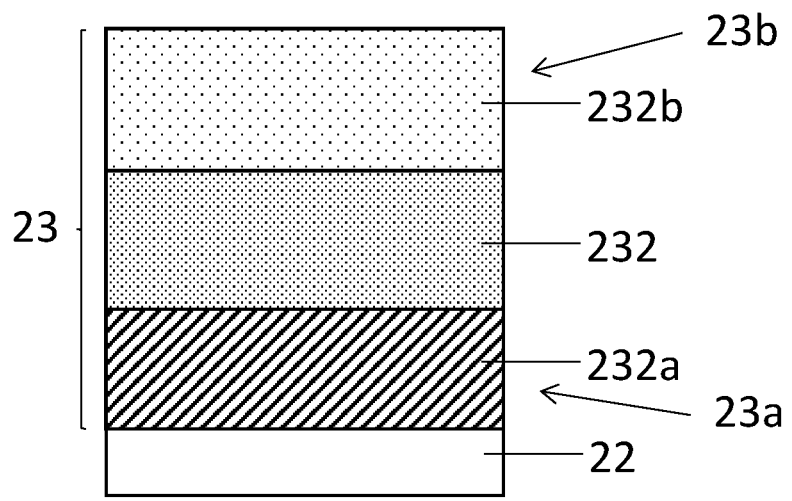
FIG. 4 represents the sense layer comprising a multilayer structure, according to another embodiment.

The multilayer structure may comprise more than two sublayers. In the example of FIG. 4, the sense layer 23 comprises the first sublayer 232a near the tunnel barrier layer 22 and having a chemical composition resulting in high magnetization. The sense layer 23 further comprises the second sublayer 232b, away from the tunnel barrier layer 22 and having a chemical composition resulting in low magnetization. An intermediary sublayer 232 is included between the first and second sublayers 232a, 232b. The intermediary sublayer 232 can have a ferromagnetic material composition that is varied or being constant across the sublayer thickness. The ferromagnetic material of the intermediary sublayer 232 can have a chemical composition resulting in a magnetization that is lower than the magnetization of the ferromagnetic material in the first sublayer 232a and higher than the magnetization in the second sublayer 232b.

Figure 5:
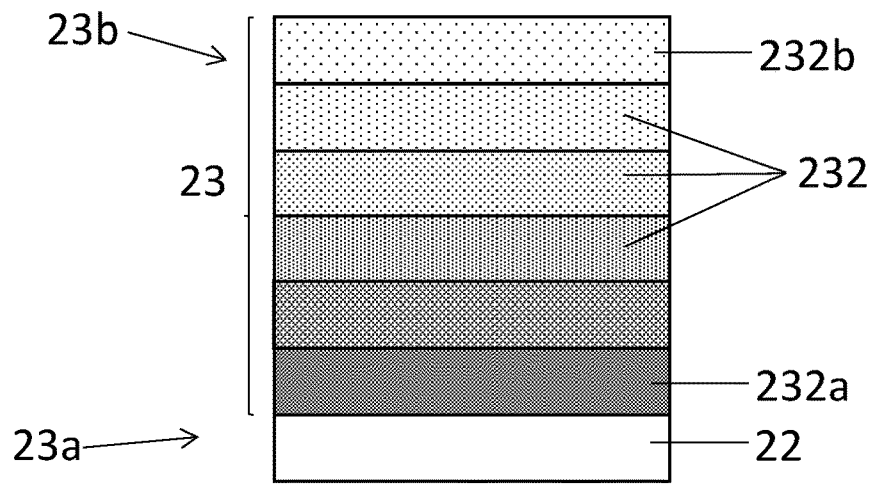
FIG. 5 represents the sense layer comprising a multilayer structure, according to yet another embodiment.

FIG. 5 shows the sense layer 23 wherein the multilayer structure comprises more than three sublayers 232, 232a, 232b. The ferromagnetic material composition can be constant across the thickness of each sublayer 232, 232a, 232b. In such configuration, the variation of the ferromagnetic material chemical composition between the regions of the sense layer 23 near the tunnel barrier layer 22 and away from the tunnel barrier layer 22 can be obtained by varying the chemical composition of the ferromagnetic material between the different sublayers 232, 232a, 232b. Alternatively, the ferromagnetic material chemical composition can be varied across the thickness of each sublayer 232, 232a, 232b, or at least across the thickness of one of the sublayers 232, 232a, 232b comprised in the multilayer structure.

Each of the first sublayer 232a and the second sublayer 232b can have a constant composition across the thickness of the sublayer 232a, 232b. Here, the variation in the ferromagnetic material magnetization can be obtained by the first sublayer 232a having a chemical composition resulting in higher magnetization, and the second sublayer 232b having a chemical composition resulting in lower magnetization.

Alternatively, at least one of the first or second sublayers 232a 232b, or both the first and second sublayers 232a 232b can have a ferromagnetic material composition being modulated across the sublayer thickness.

In FIGS. 1 to 5, a first portion of the sense layer 23 near the tunnel barrier layer 22 is indicated by the numeral 23a and a second portion 23b of the sense layer 23 away from the tunnel barrier layer 22 is indicated by the numeral 23b. In all the configurations, the ferromagnetic material composition varies across the thickness of the sense layer 23 from a composition resulting in higher magnetization near the tunnel barrier layer 22 (in the first portion 23a), to a composition resulting in a lower magnetization away from the tunnel barrier layer 22 (in the second portion 23b).

In some embodiments, the sense magnetization 230 in the first portion 23a of the sense layer 23 is at least 30% higher than the sense magnetization 230 in the second portion 23b of the sense layer 23. The first and second portions 23a, 23b can correspond to about a third of the thickness of the sense layer 23. Depending on the configuration of the sense layer 23 (such as the exemplary configurations of FIGS. 1 to 5), the first and second portions 23a, 23b can be comprised in a single layer or encompass one of more than one sublayer of a multilayer structure of the sense layer 23.

In some embodiments, the reference and sense layers 21, 23 can comprise, or can be formed of, a ferromagnetic material such as a cobalt ("Co"), iron ("Fe"), Boron ("B") or nickel ("Ni") based alloy and preferentially a CoFe, NiFe or CoFeB based alloy. The reference layer 21 can have a thickness between 2 nm and 10 nm. The reference and sense magnetization 210, 230 can have magnetic anisotropy substantially parallel to the plane of the layers 21, 23 (in-plane, as shown in FIG. 1) and/or substantially perpendicular to the plane of the layers 21, 23 (out-of-plane).

The tunnel barrier 22 can comprise an insulating material. Suitable insulating materials include oxides, such as aluminum oxide (e.g., $Al_2O_3$) and magnesium oxide (e.g., MgO). A thickness of the tunnel barrier layer 22 can be in the nm range, such as from about 1 nm to about 3 nm.

In a preferred embodiment, the sense layer 23 comprises, or is formed of, a ferromagnetic material containing a CoFe, NiFe or CoFeB based alloy, alone in in combination.

In an embodiment, the ferromagnetic material comprises a mixture containing CoFe and NiFe-based alloy where the concentration of CoFe relative to NiFe is higher near the tunnel barrier layer 22 and lower away from the tunnel barrier layer 22. In one aspect, the sense layer 23 can be configured such that the ferromagnetic material composition varies across the thickness of the sense layer 23 from a concentration of the CoFe based alloy higher than the concentration of NiFe based alloy near the tunnel barrier layer 22, to a concentration of the CoFe based alloy lower than the concentration of NiFe based alloy away from the tunnel barrier layer 22. In another aspect, the concentration of CoFe relative to NiFe can be higher in the first portion 23a and lower in the second portion 23b. In one aspect, the ferromagnetic material composition in the first portion 23a can comprise at least 95% by volume of a CoFe-based alloy and the second portion 23b can comprise at least 95% by volume of a NiFe-based alloy. In a further aspect, the first portion 23a can have a thickness of about 75% of the thickness of the sense layer 23, the second portion 23b having a thickness of about 25% of the thickness of the sense layer 23. Different thickness ratios of the first portion 23a to the second portion 23b can also be contemplated.

Referring again to FIG. 2, the magnetoresistive element 2 can comprises an interface layer 24 between the sense layer 23 and the tunnel barrier layer 22. The interface layer 24 is configured to increase the tunneling magnetoresistance (TMR) of the magnetoresistive element 2. More particularly, the interface layer 24 can comprise a CoFe or CoFeB alloy and have a thickness between 1 nm and 3 nm. Preferably, the tunnel barrier layer 22 comprises MgO.

FIG. 6 reports experimental data measured for a magnetoresistive element having a lateral dimension (diameter) of 450 nm and comprising a MgO tunnel barrier layer 22, a reference layer 21 comprising a SAF structure and an in-plane reference magnetization 210. The reference magnetization 210 is pinned by the antiferromagnetic layer 25. The measurements were performed for a sense layer 23 having a constant ferromagnetic material composition across the thickness of the sense layer 23 and having 50% by volume of CoFe and NiFe based alloy (A) or having 75% by volume of CoFe and NiFe based alloy (B). The measurements were also performed for a sense layer 23 having a varying ferromagnetic material composition across the thickness of the sense layer 23 and having 75% by volume of CoFe (C) near the tunnel barrier layer 22.

FIG. 6 shows that the sensitivity decreases with the total sense magnetization 230, when the volume percentage of the CoFe based alloy is increased relative to the volume percentage of the NiFe based alloy. For a sense layer 23 having a ferromagnetic material composition constant across the layer thickness and comprising 75% by volume of the CoFe based alloy, a sensitivity of about 1.75 mV/V/mT and an offset shift centered around 5 mV/V are measured. In the case of the sense layer 23 having a ferromagnetic material composition varying across the layer thickness and where the first portion 23a comprises a ferromagnetic material composition of about 75% by volume of CoFe, a sensitivity similar to the one measured for the ferromagnetic material composition constant across the layer thickness and comprising 75% by volume of the CoFe based alloy. However, a much lower offset shift (centered around 0 mV/V) is measured.

The sense layer 23 having a composition of the ferromagnetic material that varies across the thickness of the sense layer 23 can be obtained by using various fabrication methods. For example, the sense layer 23 can be formed using continuous alloying, formation of multilayers, alloying or layering with non-magnetic materials, or a combination of layering and alloying, such as alloying or layering with non-magnetic materials. One way to reduce the sense magnetization 230 and the ferromagnetic exchange strength is dilution of the ferromagnetic material by nonmagnetic transition metals. A composition gradient of the ferromagnetic material across the thickness of the sense layer 23 can be obtained in a single-phase ferromagnetic material with gradient of dilution across the thickness. A preferred fabrication method of the sense layer 23 includes layering and co-deposition.

Deposition methods may include chemical vapor deposition (e.g., CVD, MOCVD, and the like), molecular beam epitaxy (MBE), pulsed laser deposition (PLD), and sputtering (e.g., RF sputtering and DC sputtering).

In an embodiment illustrated in FIG. 7, a magnetic sensor device 50 comprises a plurality of the magnetoresistive element 2. Fig. shows the magnetic sensor device 50 arranged in a full-bridge configuration, however other configurations of the magnetic sensor device 50 can be contemplated, for example a half-bridge.

The magnetoresistive element 2 disclosed herein has reduced zero-field offset-shift while having a good sensitivity. The magnetoresistive element 2 can be used advantageously in a magnetic sensor device having a reduced zero-field offset-shift, even after the magnetic sensor device has been exposed to high fields. For example, the magnetic sensor device can be exposed to high magnetic fields, such as magnetic fields greater than 200 mT used during magnetic reliability testing, without significant change in its nominal performance.

REFERENCE NUMBERS AND SYMBOLS 2 magnetoresistive element
21 reference layer
210 reference magnetization
22 tunnel barrier layer
23 sense layer
23a first portion of the sense layer
23b second portion of the sense layer
230 sense magnetization
231 core
232 sublayer
232a, 232b sublayer
24 interface layer
25 antiferromagnetic layer
50 magnetic sensor device
60 external magnetic field

The invention claimed is:

1. A magnetoresistive element comprising a tunnel barrier layer included between a ferromagnetic reference layer having a fixed reference magnetization and a ferromagnetic sense layer having a free sense magnetization;
   the sense layer comprising a ferromagnetic material composition and a stable vortex configuration in the absence of an applied magnetic field;
   the ferromagnetic material composition varies across the thickness of the sense layer from a composition with higher magnetization near the tunnel barrier layer to a composition with lower magnetization away from the tunnel barrier layer, such that the free sense magnetization and ferromagnetic exchange strength of the sense layer are higher near the tunnel barrier layer than away from the tunnel barrier layer,
   wherein the free sense magnetization in a first portion of the sense layer near the tunnel barrier layer is at least 30% higher than the free sense magnetization in a second portion of the sense layer away from the tunnel barrier layer;
   wherein a concentration of CoFe relative to NiFe is higher in the first portion and lower in the second portion; and
   wherein the first portion has a thickness of 75% of the thickness of the sense layer.

2. The magnetoresistive element according to claim 1, wherein the ferromagnetic material composition comprises a composition gradient across the thickness of the sense layer.

3. The magnetoresistive element according to claim 1, wherein the sense layer comprises a multilayer structure including a first sublayer, near the tunnel barrier layer and having a composition with higher magnetization, and a second sublayer, away from the tunnel barrier layer and having a composition with lower magnetization.

4. The magnetoresistive element according to claim 3, wherein the multilayer structure comprises more than two sublayers.

5. The magnetoresistive element according to claim 3, wherein each of the first and second sublayers has a constant composition across the thickness of the sublayer, said constant composition varying between the different sublayers.

6. The magnetoresistive element according to claim 3, wherein at least one of the first and second sublayers has a composition that varies across the thickness of the sublayer.

7. The magnetoresistive element according to claim 1, wherein the first and second portions correspond to a third of the ferromagnetic sense layer thickness.

8. The magnetoresistive element according to claim 1, wherein the ferromagnetic material composition comprises a CoFe, CoFeB or NiFe based alloy.

9. The magnetoresistive element according to claim 8, wherein ferromagnetic material composition comprises a CoFe and NiFe-based alloy; and wherein the concentration of CoFe relative to NiFe is higher near the tunnel barrier layer and lower away from the tunnel barrier layer.

10. The magnetoresistive element according to claim 1, comprising an interface layer between the sense layer and the tunnel barrier layer, the interface layer comprising a CoFe or CoFeB alloy, where B refers to Boron, and having a thickness between 1 nm and 3 nm.

11. Magnetic sensor device comprising a plurality of magnetoresistive elements, each magnetoresistive element comprising a tunnel barrier layer included between a ferromagnetic reference layer having a fixed reference magnetization and a ferromagnetic sense layer having a free sense magnetization;

the sense layer comprising a ferromagnetic material composition and a stable vortex configuration in the absence of an applied magnetic field;

the ferromagnetic material composition varies across the thickness of the sense layer from a composition with higher magnetization near the tunnel barrier layer to a composition with lower magnetization away from the tunnel barrier layer, such that the sense magnetization and ferromagnetic exchange strength of the sense layer are higher near the tunnel barrier layer than away from the tunnel barrier layer;

characterized in that, the free sense magnetization in a first portion of the sense layer near the tunnel barrier layer is at least 30% higher than the free sense magnetization in a second portion of the sense layer away from the tunnel barrier layer;

wherein a concentration of CoFe relative to NiFe is higher in the first portion and lower in the second portion; and wherein the first portion has a thickness of 75% of the thickness of the sense layer.

12. The magnetic sensor device according to claim 11, arranged in a half-bridge or a full-bridge configuration.

* * * * *